(12) United States Patent
Friebe et al.

(10) Patent No.: US 11,289,994 B2
(45) Date of Patent: Mar. 29, 2022

(54) CIRCUIT ARRANGEMENT AND POWER ELECTRONIC CONVERTER CIRCUIT HAVING A DRIVER CIRCUIT AND A COIL

(71) Applicant: SMA Solar Technology AG, Niestetal (DE)

(72) Inventors: Jens Friebe, Vellmar (DE); Oliver Prior, Bad Arolsen (DE); Thomas Wappler, Guxhagen (DE)

(73) Assignee: SMA Solar Technology AG, Niestetal (DE)

( * ) Notice: Subject to any disclaimer, the term of this patent is extended or adjusted under 35 U.S.C. 154(b) by 32 days.

(21) Appl. No.: 16/862,954

(22) Filed: Apr. 30, 2020

(65) Prior Publication Data
US 2020/0259419 A1    Aug. 13, 2020

Related U.S. Application Data

(63) Continuation of application No. PCT/EP2018/079790, filed on Oct. 31, 2018.

(30) Foreign Application Priority Data

Nov. 1, 2017   (DE) .......................... 102017125548.6

(51) Int. Cl.
*H02M 1/08*    (2006.01)
*H02M 3/156*   (2006.01)
*H02M 3/158*   (2006.01)
*H02M 1/00*    (2006.01)

(52) U.S. Cl.
CPC ............. *H02M 1/08* (2013.01); *H02M 3/156* (2013.01); *H02M 1/0064* (2021.05); *H02M 3/1584* (2013.01)

(58) Field of Classification Search
CPC ................. H02M 3/155–1588; H02M 1/0064
See application file for complete search history.

(56) References Cited

U.S. PATENT DOCUMENTS

| | | | |
|---|---|---|---|
| 3,239,777 A * | 3/1966 | Mollo | H02M 3/156 331/112 |
| 4,899,065 A | 2/1990 | Nakamura | |
| 5,166,541 A | 11/1992 | Mori | |
| 2006/0013026 A1 | 1/2006 | Frank | |

(Continued)

FOREIGN PATENT DOCUMENTS

| DE | 10152879 A1 | 5/2003 |
|---|---|---|
| DE | 102010063274 B3 | 1/2012 |

OTHER PUBLICATIONS

Edward Herbert; "Design and Application of Matrix Transformers and Symmetrical Converters", A Seminar Presented at the Fifth International High Frequency Power Conversion Conference '90, Santa Clara, California, May 11, 1990.

*Primary Examiner* — Peter M Novak
(74) *Attorney, Agent, or Firm* — Eschweiler & Potashnik, LLC

(57) ABSTRACT

A circuit arrangement includes a power semiconductor switch, a freewheeling diode, and a storage choke having a core and a winding coupled between a first choke terminal and a second choke terminal. The storage choke is configured to conduct a current flowing across the power semiconductor switch. The arrangement also includes a driver circuit configured to drive the power semiconductor switch via the control terminal thereof.

16 Claims, 5 Drawing Sheets

(56) References Cited

U.S. PATENT DOCUMENTS

2006/0226708 A1 10/2006 Schlapbach
2007/0200613 A1 8/2007 Ishikawa
2008/0197904 A1 8/2008 Bolz
2010/0164435 A1 7/2010 Bartling

* cited by examiner

CIRCUIT ARRANGEMENT AND POWER ELECTRONIC CONVERTER CIRCUIT HAVING A DRIVER CIRCUIT AND A COIL

CROSS REFERENCE TO RELATED APPLICATIONS

This application is a continuation of International Patent Application number PCT/EP2018/079790, filed on Oct. 31, 2018, which claims priority to German Patent Application number 102017125548.6, filed on Nov. 1, 2017, and is hereby incorporated by reference in its entirety.

FIELD

The disclosure relates to a circuit arrangement comprising a power semiconductor switch, a freewheeling diode, a storage choke, and a driver circuit. The disclosure furthermore relates to a power electronic converter circuit having such a circuit arrangement and to a power electronic converter circuit having two such circuit arrangements.

BACKGROUND

Digital circuits, in particular microprocessors, are frequently used to generate control signals for a power semiconductor switch. However, the output currents or output voltages made available by digital circuits are frequently not sufficient to directly drive a power semiconductor switch. For this reason, driver circuits providing a current and voltage of the required level are placed between the digital circuit and the power semiconductor switch.

In power electronics there is in many converter circuits a series connection of two power semiconductors, which alternately conduct a current between one of the terminal points of the series connection and a connection point between the power semiconductors. As a result, the potential at the connection point jumps between the values of the potentials at the terminal points of the series connection depending on which of the power semiconductors is currently conducting. These potential jumps can reach an order of magnitude of several hundred volts.

For the case that one of the power semiconductors is an actively drivable power semiconductor switch that is driven using a driver circuit by way of applying a voltage between the connection point and a control terminal of the power semiconductor switch, the driver circuit is connected to the reference potential that is thus present for driving at the connection point. As a consequence thereof, potential jumps of the same order of magnitude as at the connection point also occur within the driver circuit and also in the signal for driving the power semiconductor switch.

In particular, in the case of power semiconductor switches that switch rapidly, large temporal voltage changes du/dt consequently arise not only at the power semiconductor switch, but also at components of the driver circuit. Due to this, high undesirable currents occur owing to parasitic coupling capacitances at the components of the driver circuit.

A typical countermeasure is the reduction of coupling capacitances. However, in the case of rapidly switching power semiconductor switches and the associated driver circuits, limits on the basis of the spatial extent of the components arise. Reducing the coupling capacitances requires significant effort and consequently high costs. In particular, there is only a limited selection of suitable components to use in connection with the modern, rapidly switching power semiconductor switches.

A further possible measure is to eliminate or reduce undesirable currents caused by capacitive coupling by using filter measures, which likewise entails additional effort and costs.

Document WO 2004/102806 A1 discloses connecting a reference potential and a control signal of a driver circuit via a common mode filter to a power semiconductor switch in the case of voltages induced on account of parasitic inductances during switching operations of the power semiconductor switch. The background in that case is the object of achieving equal dynamic current distribution in the case of parallel-connected power semiconductor switches using only one driver circuit. The common mode filter here also means additional effort and consequently also costs.

SUMMARY

The disclosure is directed to a circuit arrangement and a power electronic converter circuit, making a reduction of parasitic currents due to coupling capacitances possible in the case of a series connection of two power semiconductors.

A circuit arrangement comprises a power semiconductor switch having a control terminal, a reference potential terminal and a controlled terminal, a freewheeling diode, a storage choke having a winding between a first choke terminal and a second choke terminal and a core. The storage choke is configured to conduct a current flowing across the power semiconductor switch, and a driver circuit. The driver circuit is configured to drive the power semiconductor switch via the control terminal thereof. Driving is effected in this case by applying a voltage between the control terminal and the reference potential terminal of the power semiconductor switch, whereby a current flow from the controlled terminal to the reference potential terminal is controlled.

The control terminal can be, for example, a gate terminal of an IGBT (isolated gate bipolar transistor) or of a MOSFET (metal oxide semiconductor field effect transistor), the reference potential terminal can be an emitter terminal of the IGBT or a source terminal of the MOSFET, and the controlled terminal can be a collector terminal of the IGBT or a drain terminal of the MOSFET.

In a circuit arrangement of the type mentioned in the introductory part, the controlled terminal of the power semiconductor switch is connected to a first terminal point and the reference potential terminal of the power semiconductor switch is connected to a connection point. The connection point, in turn, is connected via the freewheeling diode to a second terminal point, wherein the freewheeling diode is reverse-biased from the connection point to the second terminal point. Furthermore, the connection point is connected to the first choke terminal, and the second choke terminal is connected to a third terminal point.

If, in the course of the present description, something is referred to as being connected to something else, this always refers to a direct connection, that is to say a connection via a line with an ohmic resistance that is ideally assumed to be low and an inductance that is assumed to be low or by way of a component that, by comparison with such a line, causes at best negligible additional voltage drops or current changes, such as for example a measurement resistor (shunt) or an impedance formed by a ferrite beads. Any other connection, in the course of the present description, is always explicitly referred to as being connected via a component or via a component arrangement, for example via a resistor or via a diode or for example via a series connection of two transistors. Such a connection is then also always realized only via the component mentioned or the component arrangement mentioned rather than via further components, except for any additional components that cause at best negligible additional voltage drops or current changes. Lastly, to the extent that the term "coupled" is employed, such term does not preclude intervening elements, but is not intended to convey that every circuit node is "coupled" to every other node in the circuit. Rather, it is intended to be considered to convey a circuit functional connection between the two elements in a manner fully understood and appreciated by one of skill in the art. Lastly, the above definitions are directed to how language in the claims are to be construed, and use of either "connected" or "coupled" in the detailed description should not be construed as limiting a meaning of how things are connected in any manner, rather the detailed description merely show examples to understand the disclosure.

According to the disclosure, a reference potential terminal of the driver circuit is now connected to the third terminal point directly or via an impedance, and at least one further winding that is coupled inductively to the winding of the storage choke via the core is present. The at least one further winding is here configured for conducting a signal of the driver circuit.

The circuit arrangement according to the disclosure is based on the finding that owing to the storage choke that is connected therebetween, significantly smaller jumps, which may transfer to components within the driver circuit, or no more jumps at all, occur for the potential at the third terminal point as compared to the potential at the connection point. Furthermore, the circuit arrangement according to the disclosure is advantageous to the effect that significantly more freedoms exist in respect of a spatial placement of the components of the driver circuit, whereas, in the case of a direct connection of the reference potential terminal of the driver circuit to the connection point, as is typical in the prior art, the components must be arranged as closely as possible to the connection point, and consequently also as closely as possible to the power semiconductor switch, so as to keep coupling capacitances small.

Via the inductive coupling of the at least one further winding to the winding of the storage choke that is present in the circuit arrangement according to the disclosure, the voltage changes over the winding of the storage choke are transferred to the at least one further winding, such that, in this case, if a signal of the driver circuit is conducted over the at least one further winding, a signal is present at the control terminal of the power semiconductor switch that has at any point in time the same potential difference to the jumping potential at the connection point as a control signal that is given by the driver circuit has with respect to the resting potential at the reference potential terminal of the driver circuit.

A storage choke for conducting a current flowing across the power semiconductor switch is generally already present in circuit arrangements in, for example, power electronic converter circuits, which means that the at least one further winding that is provided according to the disclosure can be advantageously applied without much effort onto the core of the storage choke that is already present. Since the at least one further winding is provided only to conduct a signal of the driver circuit, the at least one further winding, in contrast to the winding of the storage choke, also does not need to be designed for currents that are as large as the currents flowing over the winding of the storage choke.

In an advantageous embodiment, the at least one further winding can be inductively coupled to the winding of the storage choke in such a way that a voltage drop across the winding of the storage choke is added to a voltage of the signal with respect to a reference potential at the third terminal point. The transfer factor between the winding of the storage choke and the at least one further winding is at least approximately 1:1 for that purpose.

In this embodiment, for example a control signal as is provided by the driver circuit in the case of a connection of the reference potential input of the driver circuit that is direct according to the prior art to the connection point can be conducted directly from the driver circuit to the control terminal of the power semiconductor switch over the at least one further winding without the need for it to be additionally adapted specifically before or after the at least one further winding.

As already mentioned, the signal can be a control signal for the power semiconductor switch, that is to say a signal that drives the power semiconductor switch via the control terminal thereof. According to a further advantageous embodiment of the disclosure, the signal can also be a voltage supply signal of the driver circuit, in which case either only the voltage supply signal is conducted across a further winding, or both the voltage supply signal and the control signal are conducted via one further winding each.

The voltage supply signal can be a positive or a negative voltage supply signal. In addition, it is thus possible for two voltage supply signals to be conducted across a further winding in each case.

The potential of the negative voltage supply signal in driver circuits is frequently identical to the reference potential for a control signal. In this case, if the negative voltage supply signal is conducted across a further winding, it is advantageous to provide the optional impedance rather than the direct connection between the reference potential terminal of the driver circuit and the third terminal point in order to obviate the need for the further winding for the negative voltage supply signal to be designed for a current of the order of magnitude of the current flowing over the winding of the storage choke. The impedance can be, for example, an inductor, a capacitor or an ohmic resistor.

In an advantageous embodiment, the signal can also be a signal between two components of the driver circuit. In other words, the signal is then no longer supplied directly from a signal terminal of the driver circuit over the at least one further winding and a line to the control terminal of the power semiconductor switch.

Such a circuit arrangement is advantageous with respect to a greater flexibility in the spatial arrangement of components of the driver circuit, since some of the components can be arranged closely to the power semiconductor switch and some other components can be arranged further away from the power semiconductor switch. Such a circuit arrangement is furthermore advantageous in as far as for example signal preparation, in particular an adaptation, of the signal can take place before or after it flows through the at least one further winding. This provides in particular greater flexibility in terms of the design of the inductive coupling between the further winding and the winding of the storage choke.

Of course, it is also possible for a plurality of signals to be conducted between two or more components of the driver circuit over in that case one further winding each. The use of number words here, as is generally the case over the course of the present description and in the patent claims, should consequently be understood to mean at least said number. The explicit reference to a number as at least said number serves in some places merely for additionally illustrating this fact.

A circuit arrangement according to the disclosure can furthermore comprise, in a further embodiment, a further power semiconductor switch having a further control terminal, a further reference potential terminal, and a further controlled terminal, and also a further driver circuit that is connected to the further control terminal for driving the further power semiconductor switch. The further controlled terminal is then connected to the connection point, and the further reference potential terminal is connected to the second terminal point. This embodiment can furthermore comprise a freewheeling diode. The first terminal point is then connected to the connection point via the further freewheeling diode, wherein the further freewheeling diode is reverse-biased from the first terminal point to the connection point.

In this embodiment, the freewheeling diode and the further power semiconductor switch are connected in anti-parallel fashion, that is to say the flow directions through the freewheeling diode and the further power semiconductor switch are opposite one another. The freewheeling diode in this case can also be an intrinsic diode of the further power semiconductor switch, that is to say it can be for example a body diode of a MOSFET or a diode integrated in a semiconductor module of an IGBT. The freewheeling diode can, however, also be a diode that is additionally connected in anti-parallel fashion to the further power semiconductor switch, independently of whether or not the further power semiconductor switch has an intrinsic diode.

This embodiment likewise involves an anti-parallel connection of the power semiconductor switch and the further freewheeling diode. In this case, too, the further freewheeling diode can be an intrinsic diode of the power semiconductor switch or an additional diode that is connected in anti-parallel fashion thereto, independently of whether or not the power semiconductor switch has an intrinsic diode.

This embodiment having a further power semiconductor switch and a further freewheeling diode, furthermore involves a series connection of two power semiconductor switches with in each case a freewheeling diode that is connected in anti-parallel fashion, wherein a storage choke is connected at a connection point. The embodiment according to the disclosure thus provides an enhancement according to the disclosure of a circuit arrangement, as is used for example in conventional bidirectional boost converters or buck converters, which are known as synchronous converters, and in half-bridge circuits in inverters or rectifiers.

A further advantageous embodiment of the disclosure can make provision for the inductive coupling between the winding of the storage choke and the at least one further winding to be configured such that, in the case of complete or partial saturation of the core, the coupling is reduced such that a difference voltage occurs, which has the effect, directly or via one of the components of the driver circuit, that the power semiconductor switch is switched off or is kept in a linear operating point.

In the case of a fault, the occurrence of a current that is too large within the circuit arrangement or an operation of the circuit arrangement with a saturated core is thereby automatically prevented.

Furthermore, in an advantageous embodiment of the circuit arrangement according to the disclosure, the inductive coupling between the winding of the storage choke and the at least one further winding can be designed such that the at least one further winding provides a supply power for the driver circuit.

The supply power required for the driver circuit is only low as compared to the power transported due to the current flow through the storage choke, with the result that the supply power for the driver circuit can be branched off herefrom via the at least one further winding without significantly influencing the function of the circuit arrangement.

It can also be considered to be advantageous that the second choke terminal is connected via a measurement resistor to the third terminal point. The second choke terminal is here then connected to a measurement terminal of the driver circuit.

As a result, in contrast to a driver circuit, the reference potential terminal of which is connected to the connection point according to the prior art, it is possible then to measure the current flowing through the storage choke with relatively small effort and to use it for example for a regulation within the driver circuit.

In a further advantageous embodiment of the circuit arrangement according to the disclosure, a capacitor can be connected between the first terminal point and the second terminal point.

Such a capacitor can effectuate a smoothing of the voltage between the first terminal point and the second terminal point, which is advantageous when using the circuit arrangement according to the disclosure in a power electronic converter circuit. The capacitor can also temporarily store energy flowing across the first terminal point and the second terminal point, that is to say it then fulfills the function of a voltage link circuit.

In yet a further advantageous embodiment of the circuit arrangement according to the disclosure, a capacitor can be connected between the third terminal point and the second terminal point, or, alternatively, in yet a further advantageous embodiment, between the third terminal point and the first terminal point.

Said capacitors can likewise effectuate smoothing of the voltage between the terminal points between which they are connected or temporarily store energy flowing across said terminal points.

It is a further object of the disclosure to provide a power electronic converter circuit of the type mentioned in the introductory part having a circuit arrangement of the type mentioned in the introductory part, making a reduction of parasitic currents due to coupling capacitances possible in the case of a series connection of two power semiconductors.

A power electronic converter circuit according to the disclosure comprises a circuit arrangement according to the disclosure in accordance with one of the previously described embodiments. The power electronic converter circuit can here be, for example, a boost converter, a buck converter, a synchronous converter, a rectifier, or an inverter. The terminal points of the circuit arrangement then form input or output terminals of the power electronic converter circuit.

It is a further feature of the disclosure to provide a power electronic converter circuit of the type mentioned in the introductory part having two circuit arrangements of the type mentioned in the introductory part, making a reduction of parasitic currents due to coupling capacitances possible in the case of a series connection of two power semiconductors. In one embodiment of a power electronic converter circuit having two circuit arrangements, the third terminal points of the two circuit arrangements are connected to one another and the second terminal points of the two circuit arrangements are connected to one another. In another embodiment of a power electronic converter circuit having two circuit arrangements, the third terminal points of the two circuit arrangements are connected to one another and the first terminal points of the two circuit arrangements are connected to one another.

The terminal points that are connected to one another form input or output terminals of the power electronic converter circuits. The remaining terminal points, that is to say the first or second terminal points, which can optionally also be connected to one another, likewise form input or output terminals of the power electronic converter circuits. A power electronic converter circuit according to the disclosure can of course also comprise more than two circuit arrangements according to the disclosure, the terminal points of which are then connected to one another in each case in the manner described.

A power electronic converter circuit according to the disclosure in which two or more circuit arrangements according to the disclosure are connected in the previously described form can be operated, for example, as a so-called interleaved converter by driving the power semiconductor switches and the further power semiconductor switches of a respective circuit arrangement with a time offset with respect to the corresponding power converter switches and further power converter switches of the other circuit arrangements. In that case it appears as a particular advantage of the circuit arrangement according to the disclosure that the reference potential terminals of the driver circuits of all power semiconductor switches are connected in each case to the common third terminal point, and that thus the driver circuits all have the same reference potential rather than a respectively different reference potential as is the case in the prior art owing to a connection to the respective connection point. As a result, it is possible to use, if appropriate, parts of the driver circuits of the two or more circuit arrangements together for all the circuit arrangements.

The power electronic converter circuits according to the disclosure having a connection of two or more circuit arrangements according to the disclosure in the previously described form can be, for example, a boost converter, a buck converter, a synchronous converter, a rectifier, or an inverter.

BRIEF DESCRIPTION OF THE DRAWINGS

Further expedient configurations and advantages of the disclosure are part of the description of embodiments of the disclosure with reference to the figure of the drawings. The drawings here serve for illustrating embodiments of the disclosure without limiting the disclosure to the features shown.

DETAILED DESCRIPTION

Figure 1:
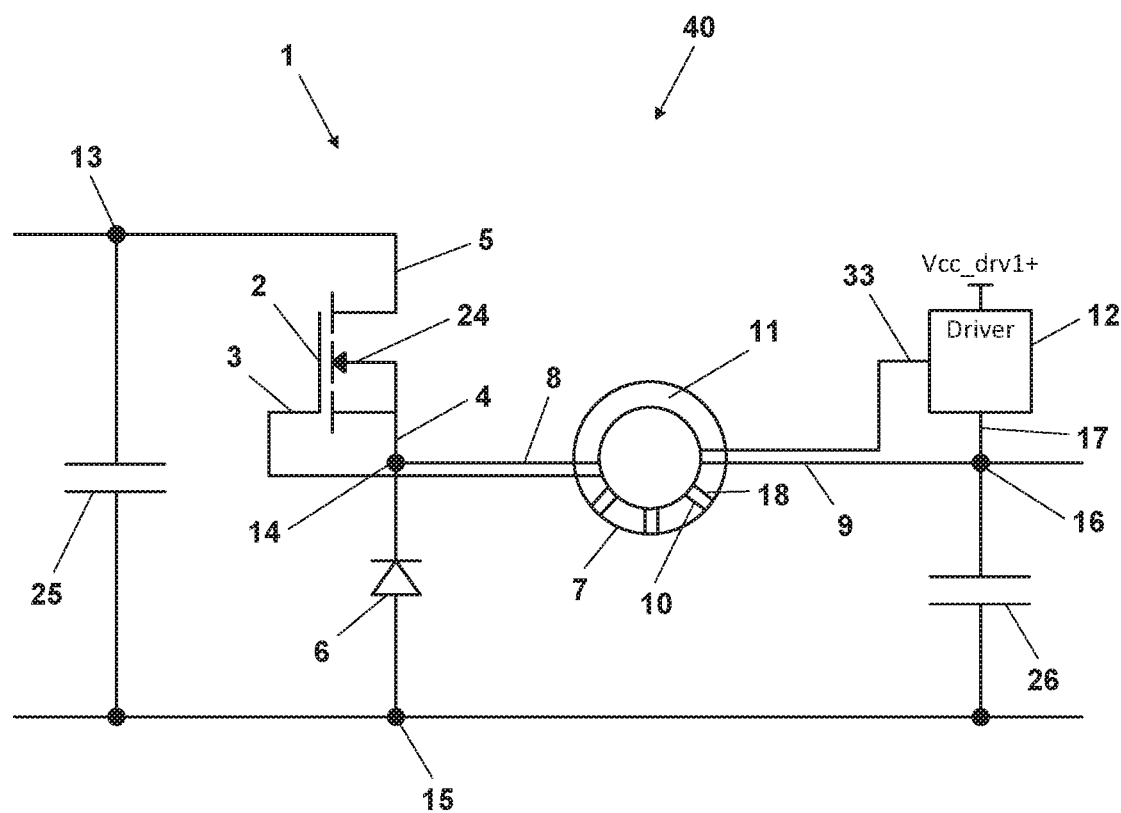
FIG. 1 schematically shows a power electronic converter circuit according to a first example embodiment of the disclosure with a circuit arrangement according to the disclosure embodied in the form of a buck converter, FIG. 2 schematically shows a power electronic converter circuit according to a second example embodiment of the disclosure with a circuit arrangement according to the disclosure embodied in the form of a boost converter, FIG. 3 schematically shows a power electronic converter circuit according to a third example embodiment of the disclosure with a circuit arrangement according to the disclosure embodied in the form of a synchronous converter, FIG. 4 schematically shows a power electronic converter circuit according to a fourth example embodiment of the disclosure with two circuit arrangements according to the disclosure embodied in the form of a bidirectional interleaved boost converter, and FIG. 5 schematically shows a power electronic converter circuit according to a fifth example embodiment of the disclosure with two circuit arrangements according to the disclosure embodied in the form of a unidirectional interleaved boost converter.

FIG. 1 shows a power electronic converter circuit 40 according to the disclosure with a circuit arrangement 1 according to the disclosure. A controlled terminal 5 of a power semiconductor switch 2, which is here embodied as a MOSFET, is connected to a first terminal point 13, and a reference potential terminal 4 is connected to a connection point 14. A freewheeling diode 6 is connected between the connection point 14 and a second terminal point 15 and is reverse-biased from the connection point 14 to the second terminal point 15. A connection to a first choke terminal 8 of a storage choke 7, which has a winding 10, wound onto a core 11, between the first choke terminal 8 and a second choke terminal 9, branches off from the connection point 14. If the power semiconductor switch 2 is closed, the current flowing across the power semiconductor switch 2 also flows across the winding 10 of the storage choke 7 and from the second choke terminal 9 to a third terminal point 16 that is connected to the second choke terminal 9.

In the circuit arrangement 1 according to the disclosure, a driver circuit 12 is present, providing, at a signal terminal 33, a signal for driving a power semiconductor switch, for example a pulse-width modulated signal (PWM signal), which switches between a reference potential that is present at a reference potential terminal 17 of the driver circuit 12, and a potential that differs herefrom, for example the potential of a voltage supply signal Vcc_drv1+ of the driver circuit 12. The reference potential terminal 17 is directly connected to the third terminal point 16. A further winding 18 is applied to the core 11, which winding is connected at its one end to the signal terminal 33 and, at its other end, to a control terminal 3 of the power semiconductor switch 2, such that the signal is conducted across the further winding 18.

The inductive coupling between the winding 10 and a further winding 18 is implemented for example such that an ideal coupling with negligible stray losses, that is to say a coupling factor of at least approximately 1, is present. In this case, if the winding 10 and the further winding 18 are wound on the core equidirectionally as in FIG. 1, a voltage drop across the winding 10 of the storage choke 7 is added to a voltage of the signal with respect to a reference potential at the third terminal point 16.

The further winding 18 requires an implementation only for a current intensity caused by the signal, which is generally significantly lower than the intensity of a current flowing through the power semiconductor switch 2 and thus through the winding 10 of the storage choke 7. In a circuit arrangement 1 according to the disclosure, a wire cross section of the further winding 18 can therefore be significantly smaller than a wire cross section of the winding 10 of the storage choke 7.

In the circuit arrangement 1 in FIG. 1, a capacitor 25, which here forms for example an intermediate DC link, is connected between the first terminal point 13 and the second terminal point 15. A capacitor 26 is likewise connected between the third terminal point 16 and the second terminal point 15, which capacitor here serves for example for smoothing the voltage between the third terminal point 16 and the second terminal point 15.

According to the example embodiment that is illustrated, the power electronic converter circuit 40 illustrated in FIG. 1 forms a buck converter, which can convert a voltage between the first terminal point 13 and the second terminal point 15, which in this case form input terminals, to a lower voltage between a third terminal point 16 and the second terminal point 15, which in this case form output terminals.

It is evident from the circuit symbol of the power semiconductor switch 2, embodied here for example in the form of a MOSFET, that it has a body diode, which is reversed-biased from the first terminal point 13 to the connection point 14. Owing to the intrinsic diode of the MOSFET, the circuit arrangement 1 thus has a further freewheeling diode 24, which, however, is not essential for the function of the power electronic converter circuit 40 as a buck converter.

Figure 2:
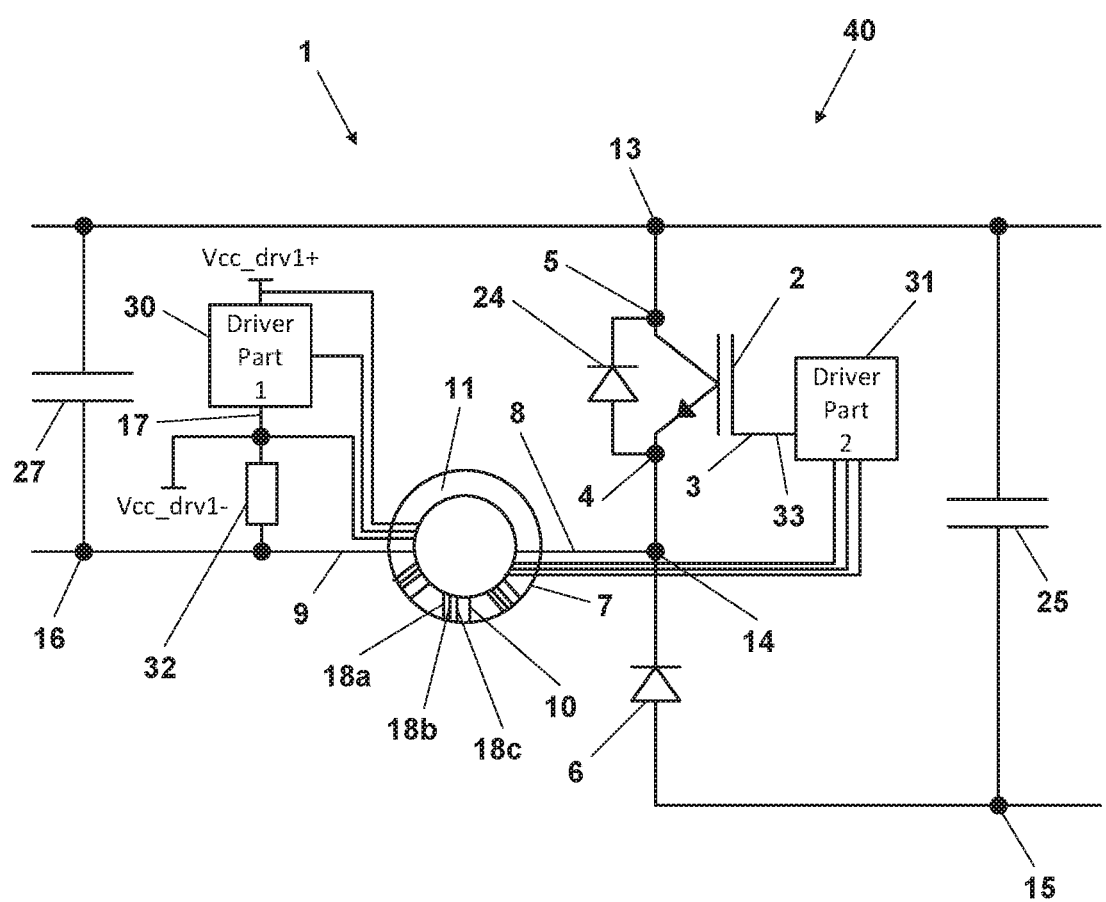

FIG. 2 shows a power electronic converter circuit 40 according to a second example embodiment of the disclosure with a circuit arrangement 1 according to the disclosure. In the power electronic converter circuit 40 according to the disclosure having a circuit arrangement 1 according to the disclosure as per the example embodiment of FIG. 2, the power semiconductor switch 2, the freewheeling diode 6 and the storage choke 7 are arranged in the same way between the first terminal point 13, the second terminal point 15, the third terminal point 16, and the connection point 14 as in the circuit arrangement 1 in FIG. 1. The power semiconductor switch 2 is here embodied as an IGBT.

The driver circuit in this example embodiment comprises a first component 30 and a second component 31. A reference potential terminal 17 of the first component 30 is connected to the third connection point 16 via an impedance 32. The impedance 32 can be, for example, an inductor, a capacitor or an ohmic resistor. A signal terminal 33 of the second component 31 is connected to the control terminal 3 of the power semiconductor switch 2.

In the present example embodiment, three further windings 18a, 18b, 18c, which are inductively coupled to the winding 10 of the storage choke 7, are applied onto the core 11 of the storage choke 7. Signals are in each case conducted between the two components 30, 31 of the driver circuit across the further windings 18a, 18b, 18c. One of the signals between the two components 30, 31 is for example a positive voltage supply signal Vcc_drv1+ of the driver circuit, another signal between the two components 30, 31 is for example a negative voltage supply signal Vcc_drv1− of the driver circuit, which, here, for example, corresponds to the reference potential terminal of the driver circuit, owing to the present direct connection of the associated signal line to the reference potential terminal 17.

In the example embodiment in FIG. 2, three signals are conducted between two components 30, 31 in each case across further windings 18a, 18b, 18c. In further example embodiments of the disclosure, it is also possible for only one signal or two signals or more than three signals to be conducted across respectively further windings between two components. Likewise, one or more signals can also be conducted between more than two components of a driver circuit across respectively further windings.

In the example embodiment in FIG. 2, furthermore both the positive voltage supply signal Vcc_drv1+ and the negative voltage supply signal Vcc_drv1− are conducted across, in each case, one further winding 18a, 18c. In other example embodiments, it is also possible for only either the positive voltage supply signal Vcc_drv1+ or the negative voltage supply signal Vcc_drv1− to be conducted across a further winding. The voltage supply signals can also be the only signals that are conducted across further windings.

In particular in the case of a driver circuit having two or more components, it is possible for signals conducted across the further windings to be suitably adapted or prepared, before or after they are conducted across the further windings, such that for example even in the case of a non-ideal coupling between the winding or the further windings a signal is present at the control terminal 3 of the power semiconductor switch 2 that is suitable for driving the power semiconductor switch 2.

In the circuit arrangement 1 in FIG. 2, a capacitor 25 is connected between the first terminal point 13 and the second terminal point 15, and a capacitor 27 is connected between the third terminal point 16 and the first terminal point 13. The power electronic converter circuit 40 in the present example embodiment then forms a boost converter, which can convert a voltage between the first terminal point 13 and the third terminal point 16, which in this case form input terminals, to a higher voltage between the first terminal point 13 and the second terminal point 15, which in this case form output terminals.

A further freewheeling diode 24, which is reversed-biased from the first terminal point 13 to the connection point 14, is connected in parallel to the power semiconductor switch 2, here embodied for example in the form of an IGBT. Said further freewheeling diode 24 can be an intrinsic diode of the IGBT, specifically for example a diode that is integrated in a semiconductor module of the IGBT, or it can be connected in parallel to the IGBT externally. However, the further freewheeling diode 24 is not essential for the function of the power electronic converter circuit 40 as a boost converter.

Figure 3:
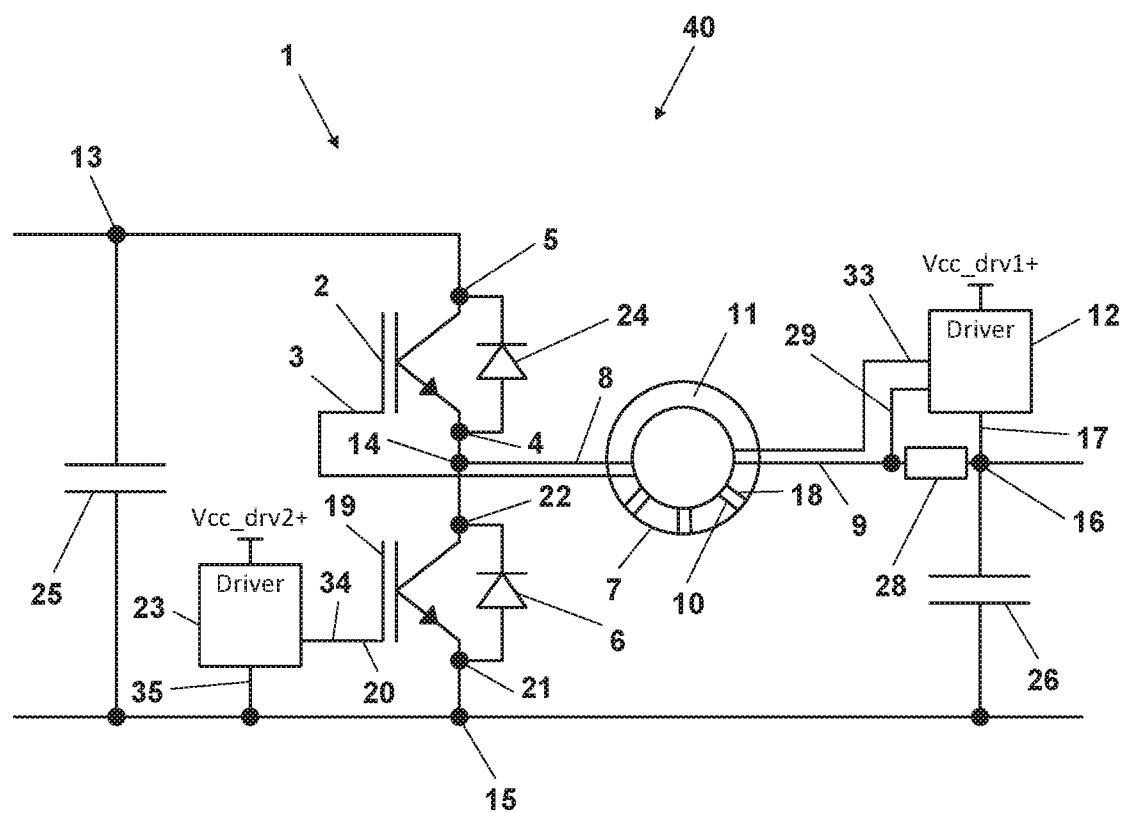

FIG. 3 shows a power electronic converter circuit 40 according to a third example embodiment of the disclosure with a circuit arrangement 1 according to the disclosure. Compared to the example embodiment of FIG. 1, in the example embodiment of a power electronic converter circuit 40 with a circuit arrangement 1 according to the disclosure of FIG. 3, a further power semiconductor switch 19, the further controlled terminal 22 of which is connected to the connection point 14 and the further reference potential terminal 21 of which is connected to the second terminal point 15, is connected in parallel to the freewheeling diode 6. A further control terminal 20 is connected to a further signal terminal 34 of a further driver circuit 23, and a further reference potential terminal 35 of the further driver circuit 23 is connected to the second terminal point 15. Such a direct connection of the reference potential terminal 35 of the further driver circuit 23 to the reference potential terminal 21 of the further power semiconductor switch 19 is possible here without any problems, because no potential jumps occur at the second terminal point 15.

The driver circuit 12 and the further driver circuit 23 can have the same configuration, although they can also have different configurations.

The further freewheeling diode 24, which is reversed-biased from the first terminal point 13 to the connection point 14, is connected in parallel to the power semiconductor switch 2.

Furthermore, the second choke terminal 9 in the present example embodiment is connected via a measurement resistor 28 to the third terminal point 16, and the second choke terminal 9 is connected to a measurement terminal 29 of the driver circuit 12. In this way, a current sensor system for the current flowing through the storage choke 7, which system can be used for example for a regulation within the driver circuit 12, is implemented with relatively small effort.

The power electronic converter circuit 40 in the present example embodiment forms a so-called synchronous converter, which can convert a voltage between the first terminal point 13 and the second terminal point 15 into a lower voltage between the third terminal point 16 and the second terminal point 15, or, vice versa, can convert a voltage between the third terminal point 16 and the second terminal point 15 into a higher voltage between the first terminal point 13 and the second terminal point 15. The power electronic converter circuit 40 in FIG. 3 can therefore be used as a bidirectional boost or buck converter, depending on which of the terminal points are used as input or output terminals.

The series connection of two power semiconductor switches 2, 19 with diodes 24, 6, being connected in anti-parallel fashion, as is present in the circuit arrangement 1 in FIG. 3, is known in power electronics also as a half-bridge circuit and forms the basis for bridge circuits of inverters or rectifiers, such as for example an H bridge or a B6 bridge. The power electronic converter circuit 40 in the present example embodiment in FIG. 3 thus equally also forms a bridge arm of an inverter or of a rectifier.

The freewheeling diode 6 and the further freewheeling diode 24 are advantageous for the function of the power electronic converter circuit 40 in FIG. 3 as a synchronous converter, a bidirectional boost converter or buck converter, an inverter bridge arm or a rectifier bridge arm.

The power semiconductor switch 2 and the further power semiconductor switch 19 in the example embodiment in FIG. 3 are embodied for example in the form of IGBTs, but can likewise be embodied for example in the form of MOSFETs.

Figure 4:
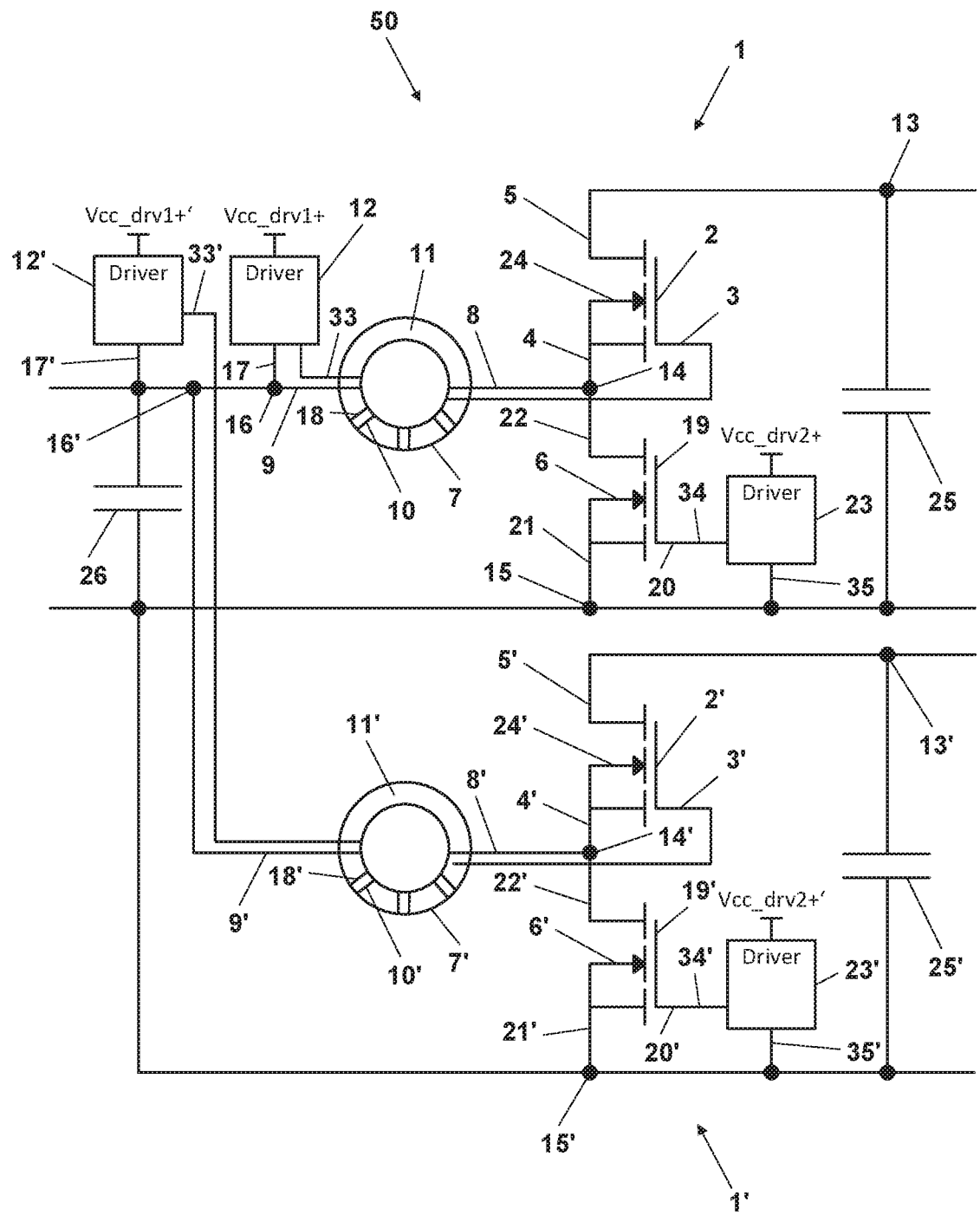

FIG. 4 shows a power electronic converter circuit 50 according to a fourth example embodiment of the disclosure with two circuit arrangements 1, 1' according to the disclosure. In the example embodiment of the power electronic converter circuit 50 according to the disclosure in FIG. 4 in the form of a bidirectional interleaved boost converter, two circuit arrangements 1, 1' according to the disclosure, which each form bidirectional boost converters, are connected in parallel by way of the third terminal points 16, 16' of the two circuit arrangements 1, 1' being connected to one another and the second terminal points 15, 15' of the two circuit arrangements 1, 1' being connected to one another and representing input terminals of the power electronic converter circuit 50. The first terminal points 13, 13' and the second terminal points 15, 15' represent output terminals of the bidirectional interleaved boost converter. The first terminal points 13, 13' of the two circuit arrangements 1, 1' can optionally likewise be connected to one another.

It is also possible in the power electronic converter circuit 50 according to the disclosure for more than two circuit arrangements according to the disclosure to be connected in parallel by way of connecting all third terminal points of all circuit arrangements and connecting all second terminal points of all circuit arrangements, wherein it is optionally also possible for all first terminal points of all circuit arrangements to be connected.

Figure 5:
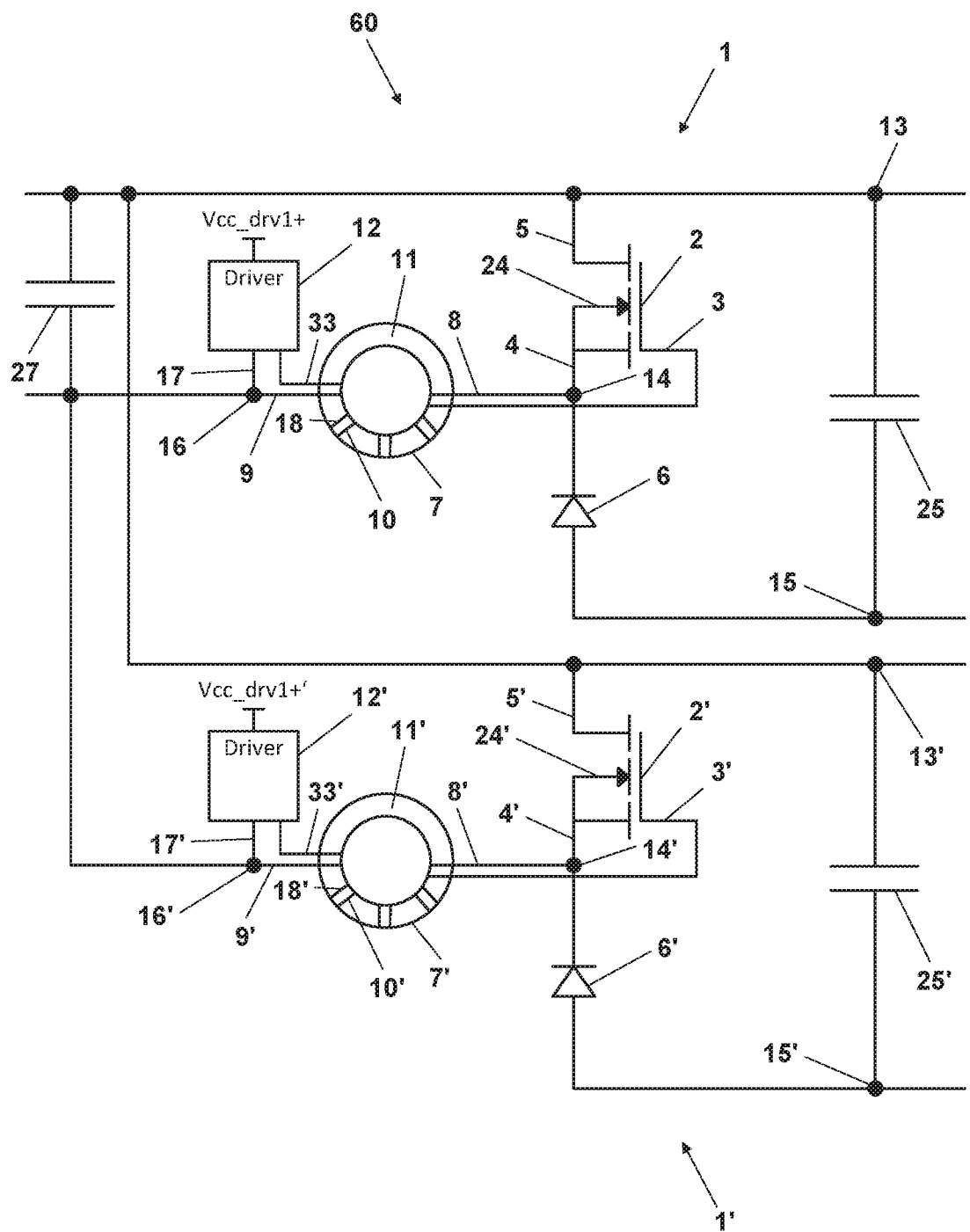

Finally, FIG. 5 shows a fifth example embodiment of a power electronic converter circuit 60 according to the disclosure as a unidirectional interleaved boost converter. Here, two circuit arrangements 1, 1' according to the disclosure, which each form unidirectional boost converters, are connected in parallel by way of the third terminal points 16, 16' of the two circuit arrangements 1, 1' being connected to one another and the first terminal points 13, 13' of the two circuit arrangements 1, 1' being connected to one another and representing input terminals of the power electronic converter circuit 60. The first terminal points 13, 13' and the second terminal points 15, 15' represent output terminals of the unidirectional interleaved boost converter, wherein the second terminal points 15, 15' of the two circuit arrangements 1, 1' can optionally likewise be connected to one another.

It is also possible in this case in the power electronic converter circuit 60 according to the disclosure for more than two circuit arrangements according to the disclosure to be connected in parallel by way of connecting the third terminal points of all circuit arrangements and connecting the first terminal points of all circuit arrangements, wherein it is optionally also possible for all second terminal points of all circuit arrangements to be connected.

In the example embodiments of power electronic converter circuits 50, 60 according to the disclosure in FIGS. 4 and 5, the reference potential terminals 17, 17' of the driver circuits 12, 12' for the power semiconductor switches 2, 2' are connected to the interconnected third terminal points 16, 16', and thus all to the same reference potential. This permits common utilization of parts of the driver circuits 12, 12' for the power semiconductor switches 2, 2' for all circuit arrangements 1, 1', which simplifies the circuit design and reduces the circuit complexity.

The disclosure is not limited to the embodiments that are explicitly shown, but can be modified in varied ways, in particular can be combined with other embodiments shown or with embodiments that are known to a person skilled in the art.

The invention claimed is:

1. A circuit arrangement, comprising:
a power semiconductor switch having a control terminal, a reference potential terminal and a controlled terminal;
a freewheeling diode;
a storage choke having a core and a winding coupled between a first choke terminal and a second choke terminal, wherein the storage choke is configured to conduct a current flowing across the power semiconductor switch; and
a driver circuit configured to drive the power semiconductor switch via the control terminal thereof,
wherein the controlled terminal of the power semiconductor switch is connected to a first terminal point,
wherein the reference potential terminal of the power semiconductor switch is connected to a connection point,
wherein the connection point is connected via the freewheeling diode to a second terminal point and oriented such that the freewheeling diode is reverse-biased from the connection point to the second terminal point,
wherein the connection point is connected to the first choke terminal functionally independent of an operational state of the power semiconductor switch, and
wherein the second choke terminal is connected to a third terminal point,
a reference potential terminal of the driver circuit is connected to the third terminal point directly or via an impedance, and wherein at least one further winding is coupled inductively to the winding of the storage choke via the core, and wherein the at least one further winding is configured for conducting a signal of the driver circuit.

2. The circuit arrangement as claimed in claim 1, wherein the at least one further winding is inductively coupled to the winding of the storage choke such that a voltage drop across the winding of the storage choke is added to a voltage of the signal with respect to a reference potential at the third terminal point.

3. The circuit arrangement as claimed in claim 1, wherein the signal drives the power semiconductor switch via the control terminal thereof.

4. The circuit arrangement as claimed in claim 1, wherein the signal is a pulse-width modulated signal of the driver circuit.

5. The circuit arrangement as claimed in claim 1, wherein the signal is a voltage supply signal of the driver circuit.

6. The circuit arrangement as claimed in claim 1, wherein the signal is a signal between two components of the driver circuit.

7. The circuit arrangement as claimed in claim 1, further comprising a further power semiconductor switch having a further control terminal, a further reference potential terminal, and a further controlled terminal, and a further driver circuit that is connected to the further control terminal for driving the further power semiconductor switch, wherein the further controlled terminal is connected to the connection point and the further reference potential terminal is connected to the second terminal point, and furthermore comprising a further freewheeling diode, wherein the first terminal point is connected via the further freewheeling diode to the connection point in a manner such that the further freewheeling diode is reversed-biased from the first terminal point to the connection point.

8. The circuit arrangement as claimed in claim 1, wherein the inductive coupling between the winding of the storage choke and the at least one further winding is configured such that, in the case of complete or partial saturation of the core, the coupling is reduced such that a difference voltage occurs, which has an effect, directly or via a component of the driver circuit, that the power semiconductor switch is switched off or is kept in a linear operating mode.

9. The circuit arrangement as claimed in claim 1, wherein the inductive coupling between the winding of the storage choke and the at least one further winding is designed such that the at least one further winding provides a supply power for the driver circuit.

10. The circuit arrangement as claimed in claim 1, wherein the second choke terminal is connected via a measurement resistor to the third terminal point, and wherein the second choke terminal is connected to a measurement terminal of the driver circuit.

11. The circuit arrangement as claimed in claim 1, further comprising a capacitor coupled between the first terminal point and the second terminal point.

12. The circuit arrangement as claimed in claim 1, further comprising a capacitor coupled between the third terminal point and the second terminal point.

13. The circuit arrangement as claimed in claim 1, further comprising a capacitor coupled between the third terminal point and the first terminal point.

14. A power electronic converter circuit having a circuit arrangement as claimed in claim 1.

15. A power electronic converter circuit, comprising:
a first circuit arrangement, and a second circuit arrangement,
wherein each of the first circuit arrangement and the second circuit arrangement comprise a circuit arrangement as claimed in claim 1, wherein the third terminal points of the first and second circuit arrangements are connected to one another and the second terminal points of the first and second circuit arrangements are connected to one another.

16. A power electronic converter circuit, comprising:
a first circuit arrangement and a second circuit arrangement,
wherein each of the first circuit arrangement and the second circuit arrangement comprise a circuit arrangement as claimed in claim 1, wherein the third terminal points of the first and second circuit arrangements are connected to one another and the first terminal points of the first and second circuit arrangements are connected to one another.

\* \* \* \* \*